US010602642B2

United States Patent
Yang

(10) Patent No.: US 10,602,642 B2
(45) Date of Patent: Mar. 24, 2020

(54) BACK COVER UNIT APPLIED TO PORTABLE DEVICE AND HAVING HEAT CONDUCTION FUNCTION

(71) Applicant: ASIA VITAL COMPONENTS CO., LTD., New Taipei (TW)

(72) Inventor: Hsiu-Wei Yang, New Taipei (TW)

(73) Assignee: Asia Vital Components Co., Ltd., New Taipei (TW)

(*) Notice: Subject to any disclaimer, the term of this patent is extended or adjusted under 35 U.S.C. 154(b) by 0 days.

(21) Appl. No.: 16/033,174

(22) Filed: Jul. 11, 2018

(65) Prior Publication Data

US 2018/0368284 A1 Dec. 20, 2018

Related U.S. Application Data

(63) Continuation-in-part of application No. 14/103,000, filed on Dec. 11, 2013, now Pat. No. 10,101,779.

(51) Int. Cl.
*H05K 7/20* (2006.01)
*H04M 1/02* (2006.01)

(52) U.S. Cl.
CPC ...... *H05K 7/20418* (2013.01); *H04M 1/0202* (2013.01); *H04M 1/0206* (2013.01); *H05K 7/20436* (2013.01)

(58) Field of Classification Search
CPC ............ H05K 7/20418; H04M 1/0202; H04M 1/0204
USPC ....................................................... 361/704
See application file for complete search history.

(56) References Cited

U.S. PATENT DOCUMENTS

| 6,487,073 | B2* | 11/2002 | McCullough | G06F 1/203 |
|---|---|---|---|---|
| 7,228,894 | B2 | 6/2007 | Moore et al. | |
| 7,768,457 | B2* | 8/2010 | Pettus | H01L 23/66 |
| | | | | 343/700 MS |
| 7,778,044 | B2* | 8/2010 | Inaba | H03J 1/00 |
| | | | | 174/520 |
| 8,270,170 | B2 | 9/2012 | Hughes et al. | |
| 8,481,126 | B2 | 7/2013 | Wang et al. | |
| 2008/0151503 | A1 | 6/2008 | Aapro et al. | |
| 2011/0172274 | A1 | 7/2011 | Lange et al. | |
| 2012/0281361 | A1 | 11/2012 | Gunderson | |
| 2014/0043769 | A1 | 2/2014 | Chang et al. | |

(Continued)

FOREIGN PATENT DOCUMENTS

CN  201888066 U  6/2011
TW  201248110 A1  12/2012

(Continued)

*Primary Examiner* — Mukundbhai G Patel
(74) *Attorney, Agent, or Firm* — Thomas J. Nikolai; DeWitt LLP

(57) ABSTRACT

A back cover unit applied to portable device and having heat conduction function includes a ceramic back cover having an outer surface and an inner surface. The outer surface faces an external environment, while the inner surface faces a receiving space of a portable electronic device. A heat contact section is disposed on the inner surface in a position corresponding to at least one heat source disposed in the receiving space. The heat contact section has a contact face in contact with the heat source, whereby the heat generated by the heat source can be transferred through the heat contact section to the ceramic back cover to dissipate the heat.

6 Claims, 4 Drawing Sheets

(56) References Cited

U.S. PATENT DOCUMENTS

| 2014/0126135 A1* | 5/2014 | Abbatiello | B29C 70/68 |
| | | | 361/679.31 |
| 2014/0224456 A1* | 8/2014 | Takasu | G06F 1/20 |
| | | | 165/104.33 |

FOREIGN PATENT DOCUMENTS

| TW | 201309991 A1 | 3/2013 |
| TW | 201322874 A1 | 6/2013 |

* cited by examiner

BACK COVER UNIT APPLIED TO PORTABLE DEVICE AND HAVING HEAT CONDUCTION FUNCTION

The present application is a continuation in part of U.S. patent application Ser. No. 14/103,000, filed on Dec. 11, 2013.

BACKGROUND OF THE INVENTION

1. Field of the Invention

The present invention relates generally to heat dissipation field, and more particularly to a back cover unit applied to portable device and having heat conduction function.

2. Description of the Related Art

A handheld electronic device is a sort of portable electronic device, which can be readily and conveniently operated and used by a user. Along with the progressive increase of the arrangement density of the components of the electronic device, the volume of the electronic device has become smaller and smaller and the weight of the electronic device has become lighter and lighter. As a result, along with the minimization of the size of the electronic device, the heat dissipation problem of the electronic device has become a critical issue bothering the product designer, especially in the field of handheld electronic device.

The case of a common handheld electronic device on the market is generally made of plastic material. The handheld electronic device has a quite small volume so that the size of the electronic components in the device is miniaturized. In this case, it is hard to conduct out the heat generated by the electronic components so that it is difficult to dissipate the heat of the handheld electronic device. As a result, the electronic components in the electronic device often fail due to overheating to shorten the lifetime of the electronic device or deteriorate the performance of the electronic device.

In addition, some manufacturers in this field manufacture the case of the handheld electronic device from a great amount of metal as the mail material of the case, especially aluminum/magnesium alloy. This is because aluminum/magnesium alloy has light weight and higher strength as well as excellent appearance. Aluminum/magnesium alloy has almost become the major material of the case of the new generation handheld electronic device. However, the aluminum/magnesium alloy-made case of the handheld electronic device simply has a more beautiful appearance than the common plastic-made case, while the aluminum/magnesium alloy-made case still has no heat dissipation effect so that the heat in the case is still hard to dissipate. Under such circumstance, the lifetime of the electronic components in the case will be still shortened due to overheating. Furthermore, the aluminum/magnesium alloy-made case will shield the antenna from the signal and affect the signal receiving ability of the antenna so that the aluminum/magnesium alloy-made case cannot satisfy the layout requirement of the antenna structure.

SUMMARY OF THE INVENTION

It is therefore a primary object of the present invention to provide a back cover unit applied to portable device and having heat conduction function, which can efficiently conduct the heat generated by the portable electronic device to the case for dissipating the heat.

It is a further object of the present invention to provide the above back cover unit including a ceramic back cover as a part of the case of the portable electronic device. The ceramic back cover will not affect the signal of the antenna and serves as a heat dissipation path of the electronic components inside the portable electronic device.

To achieve the above and other objects, the back cover unit applied to portable device and having heat conduction function of the present invention includes a ceramic back cover having an outer surface and an inner surface. The outer surface faces an external environment, while the inner surface faces a receiving space of a portable electronic device. A heat contact section is disposed on the inner surface in a position corresponding to at least one heat source disposed in the receiving space. The heat contact section has a contact face in contact with the heat source, whereby the heat generated by the heat source can be transferred through the heat contact section to the ceramic back cover to dissipate the heat.

In the above back cover unit applied to portable device and having heat conduction function, a heat conduction medium is disposed between the contact face of the heat contact section and the heat source.

In the above back cover unit applied to portable device and having heat conduction function, a heat absorption layer is disposed on the inner surface of the ceramic back cover.

In the above back cover unit applied to portable device and having heat conduction function, the heat absorption layer is a porous structure or a nanometer structure body.

In the above back cover unit applied to portable device and having heat conduction function, the porous structure includes a porous ceramic structure or a porous graphite structure.

In the above back cover unit applied to portable device and having heat conduction function, the heat absorption layer has black color, sub-black color or a color of dark color system.

In the above back cover unit applied to portable device and having heat conduction function, the heat absorption layer is a high-radiation ceramic structure or a high-hardness ceramic structure.

In the above back cover unit applied to portable device and having heat conduction function, the heat absorption layer is formed on the inner surface of the ceramic back cover by means of the manufacturing process of micro arc oxidation (MAO), plasma electrolytic oxidation (PEO), anodic spark deposition (ASD) or anodic oxidation by spark deposition (ANOF).

In the above back cover unit applied to portable device and having heat conduction function, the heat contact section protrudes from the inner surface of the ceramic back cover.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
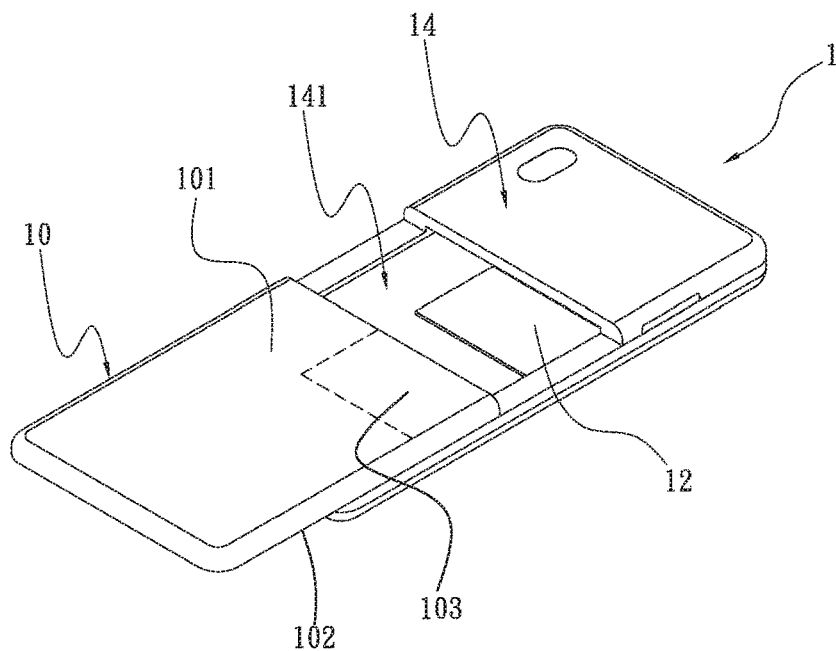
FIG. 1 is a perspective exploded view of the back cover unit applied to portable device and having heat conduction function of the present invention.
Figure 2A:
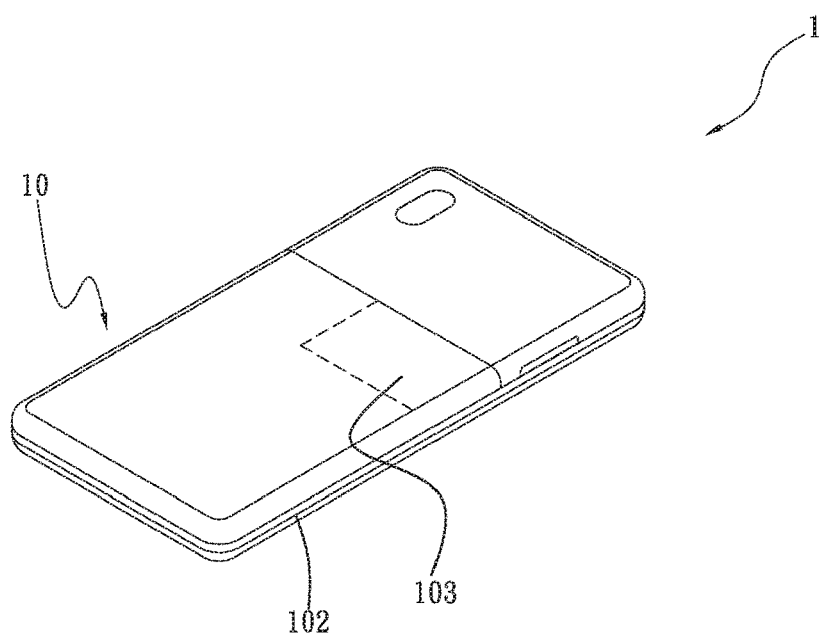
FIG. 2A is a perspective assembled view of the back cover unit applied to portable device and having heat conduction function of the present invention.
Figure 2B:
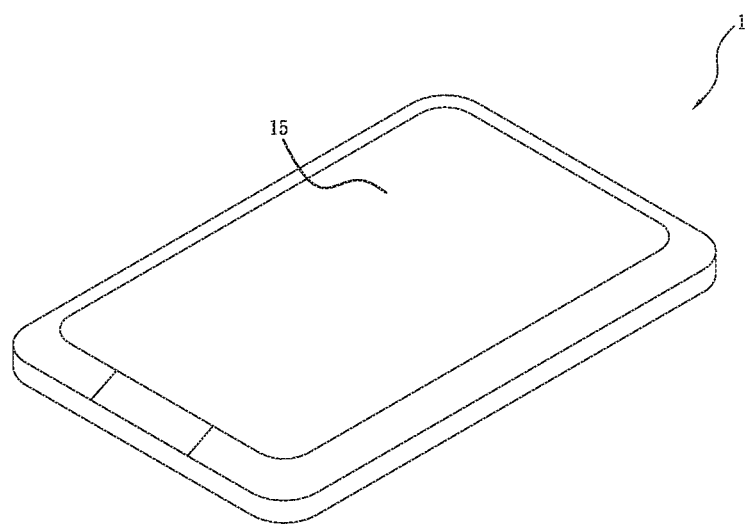
FIG. 2B is a perspective assembled view according to FIG. 2A, showing the other face of the back cover unit applied to portable device and having heat conduction function of the present invention.
Figure 3:
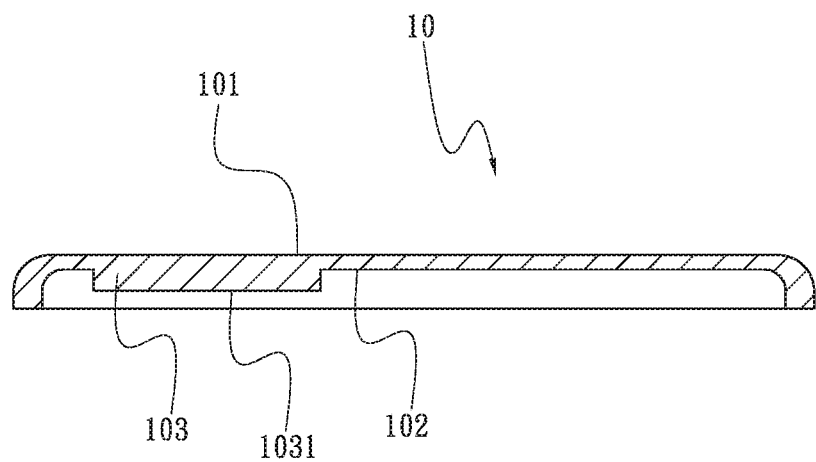
FIG. 3 is a sectional view of the ceramic back cover of the present invention.
Figure 4:
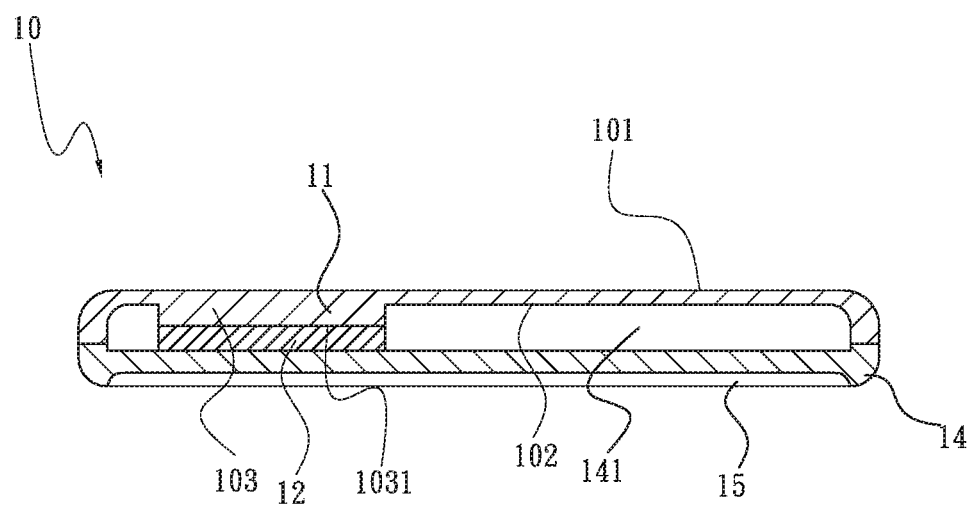
FIG. 4 is a sectional view showing an application of the back cover unit applied to portable device and having heat conduction function of the present invention.

Please refer to FIGS. 1 to 4. FIG. 1 is a perspective exploded view of the back cover unit applied to portable device and having heat conduction function of the present invention. FIG. 2A is a perspective assembled view of the back cover unit applied to portable device and having heat conduction function of the present invention. FIG. 2B is a perspective assembled view according to FIG. 2A, showing the other face of the back cover unit applied to portable device and having heat conduction function of the present invention. FIG. 3 is a sectional view of the ceramic back cover of the present invention. FIG. 4 is a sectional view showing an application of the back cover unit applied to portable device and having heat conduction function of the present invention. The back cover unit applied to portable device and having heat conduction function of the present invention includes a ceramic back cover cooperatively assembled with a portable electronic device 1 such as a cellular phone, a tablet or a tablet computer. The portable electronic device 1 includes a main body 14. One face of the main body 14 defines a receiving space 141. A screen 15 such as a touch screen is disposed on the other face of the main body 14. At least one side of the receiving space 141 is an open side. Components such as circuit boards and a battery are disposed in the receiving space 141. A heat source 12 is received in the receiving space 141. The heat source 12 is an electronic component (such as a CPU or an MCU) arranged on the circuit board or a battery.

The ceramic back cover 10 is made of a ceramic material such as zirconium oxide and/or aluminum oxide ceramics and has better elasticity, abrasion resistance and anti-scrape property. The ceramic material has another feature, that is, the ceramic material has good rigidity and can be manufactured with very thin thickness. In use, the ceramic material is uneasy to bend. The ceramic material will not affect the signal receiving ability of an antenna and can satisfy the layout requirement of 2G to 4G or 5G or even more advanced antenna structure. The ceramic back cover 10 has an outer surface 101 and an inner surface 102. The outer surface 101 is exposed to an external environment. The inner surface 102 faces the receiving space 141 of the portable electronic device 1. A heat contact section 103 is disposed on the inner surface 102 in a position corresponding to at least one heat source. The heat contact section 103 has a contact face 1031 in contact with the heat source 12, whereby the heat generated by the heat source 12 can be transferred from the top section of the heat source 12 through the contact face 1031 and the heat contact section 103 to the outer surface 101 of the ceramic back cover 10 to dissipate the heat. The heat contact section 103 protrudes from the inner surface 102 toward the heat source 12. The heat contact section 103 is integrally formed with the ceramic back cover 10 so that the protruding heat contact section 103 is made of the same material as the ceramic back cover 10.

Figure 5:
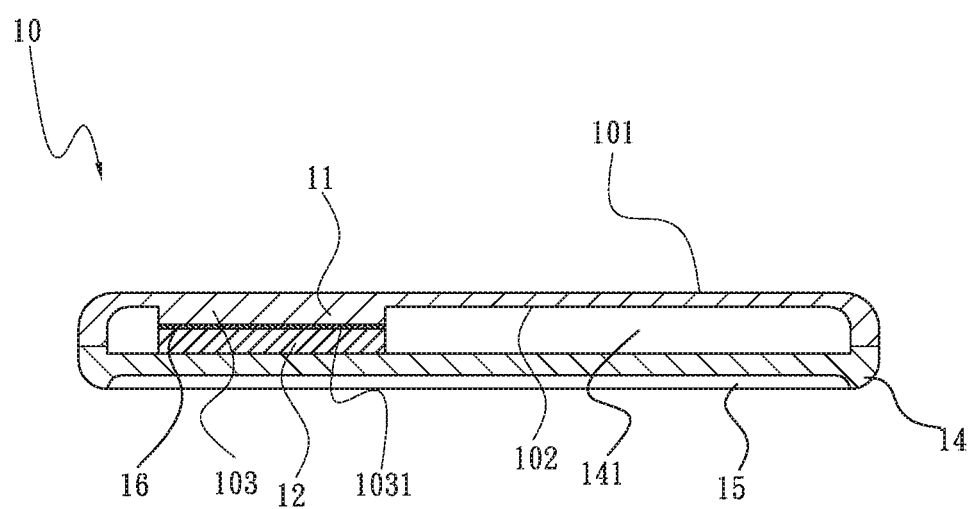
FIG. 5 is a sectional view showing another application of the back cover unit applied to portable device and having heat conduction function of the present invention.

As shown in FIG. 5, in a modified embodiment, a heat conduction medium 16 such as thermal gap filler or the like is disposed between the contact face 1031 of the heat contact section 103 and the heat source 12. The heat conduction medium 16 serves to help in transferring the heat of the heat source 12 to the heat contact section 103.

Figure 6:
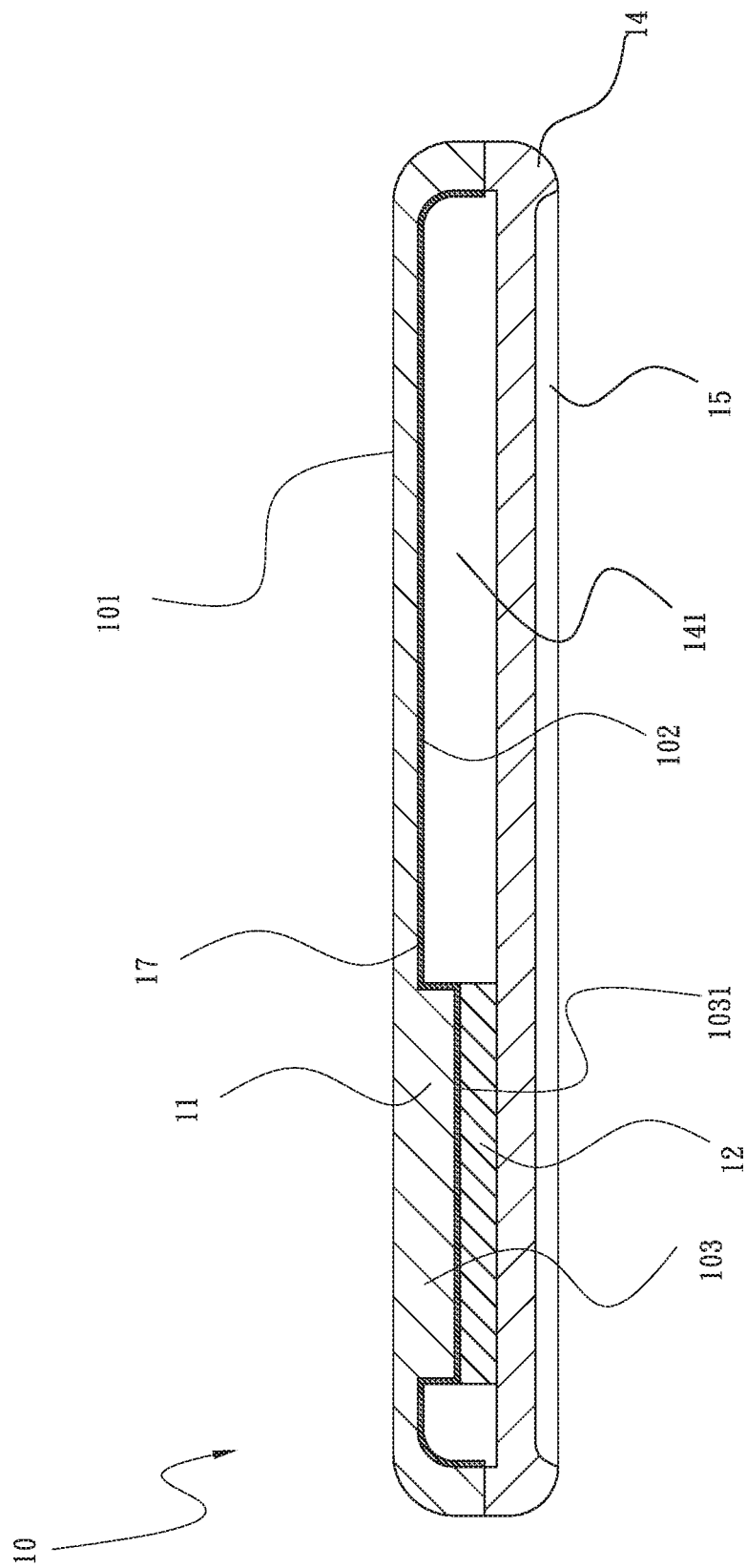
FIG. 6 is a sectional view showing still another application of the back cover unit applied to portable device and having heat conduction function of the present invention.

As shown in FIG. 6, in another modified embodiment, a heat absorption layer 17 is disposed on the inner surface 101 of the ceramic back cover 10. The heat absorption layer 17 is formed on the inner surface 101 of the ceramic back cover 10 by means of the manufacturing process of micro arc oxidation (MAO), plasma electrolytic oxidation (PEO), anodic spark deposition (ASD) or anodic oxidation by spark deposition (ANOF). The heat absorption layer 17 is overlaid or not overlaid on the heat contact section 103. In FIG. 6, the heat absorption layer 17 is overlaid on the heat contact section 103. The heat absorption layer 17 is such as a porous structure, a nanometer structure body, a high-radiation ceramic structure or a high-hardness ceramic structure. The porous structure includes a porous ceramic structure or a porous graphite structure. In a preferred embodiment, the heat absorption layer 17 has black color, sub-black color or a color of dark color system. The heat absorption layer 17 serves to absorb the radiated heat in the receiving space 141 and the heat of the heat source 12. Then, the heat is transferred to the outer surface 101 of the ceramic back cover 10 to heat-exchange with the external air for quickly dissipating the heat.

In conclusion, in comparison with the conventional device, the present invention has the following advantages:
1. The heat can be effectively dissipated to prolong the lifetime of the portable electronic device.
2. The ceramic back cover 10 has better elasticity, abrasion resistance and anti-scrape property. In addition, the ceramic back cover 10 can be manufactured with very thin thickness and is uneasy to bend in use. Therefore, the ceramic back cover 10 is applicable to various mobile devices or ultra-thin mobile devices. Moreover, the ceramic back cover 10 can satisfy the layout requirement of 2G to 4G or 5G or even more advanced antenna structure.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A back cover unit applied to portable device and having heat conduction function, comprising a ceramic back cover for assembling to a case of the portable device, the case defining a receiving space in one face and having a screen provided on other face, the ceramic back cover closing the receiving space and having an outer surface and an inner surface, the outer surface facing an external environment, the inner surface facing the receiving space of a portable electronic device, a heat conductive contact section being formed on the inner surface in a position corresponding to at least one heat source disposed in the receiving space, the heat conductive contact section having a contact face in contact with the heat source, whereby the heat generated by the heat source can be transferred through the heat conductive contact section to the ceramic back cover to dissipate the heat;
    wherein the heat conductive contact section is integrally formed with the ceramic back cover and protrudes from the inner surface of the ceramic back cover and is made of the same material as the ceramic back cover;
    wherein a heat absorption layer is disposed on the inner surface of the ceramic back cover.

2. The back cover unit applied to portable device and having heat conduction function as claimed in claim 1, wherein a heat conduction medium is disposed between the contact face of the heat conductive contact section and the heat source.

3. The back cover unit applied to portable device and having heat conduction function as claimed in claim 1, wherein the heat absorption layer is one of a porous structure and a nanometer structure body.

4. The back cover unit applied to portable device and having heat conduction function as claimed in claim 3, wherein the porous structure includes a porous ceramic structure or a porous graphite structure.

5. The back cover unit applied to portable device and having heat conduction function as claimed in claim 1, wherein the heat absorption layer is a high-radiation ceramic structure or a high-hardness ceramic structure.

6. The back cover unit applied to portable device and having heat conduction function as claimed in claim 1, wherein the heat absorption layer is formed on the inner surface of the ceramic back cover by means of the manufacturing process of micro arc oxidation (MAO), plasma electrolytic oxidation (PEO), anodic spark deposition (ASD) or anodic oxidation by spark deposition (ANOF).

\* \* \* \* \*